United States Patent [19]

Hughes et al.

[11] 4,032,766

[45] June 28, 1977

[54] WIDE RANGE CURRENT FLOW FAULT DETECTOR

[75] Inventors: Lee E. Hughes, Bellevue; John L. Marshall, Renton; Dieter Doring, Seattle, all of Wash.

[73] Assignee: Tally Corporation, Kent, Wash.

[22] Filed: May 17, 1976

[21] Appl. No.: 686,880

[52] U.S. Cl. .................... 235/153 AS; 340/253 R; 361/93; 361/86

[51] Int. Cl.² .................. G06F 11/00; H02H 3/38

[58] Field of Search ............... 235/153 AS, 153 A; 317/27 R, 31; 101/93; 340/253 R, 253 B

[56] References Cited

UNITED STATES PATENTS

| 2,838,115 | 6/1958 | Davis | 235/153 AS |
|---|---|---|---|
| 3,287,698 | 11/1966 | Sapino | 235/153 AS |
| 3,539,786 | 11/1970 | Raehpour | 235/153 AS |
| 3,909,681 | 9/1975 | Campari | 317/31 |
| 3,956,671 | 5/1976 | Nimmersjo | 317/27 R |
| 3,978,374 | 8/1976 | Rohr | 317/27 R |

Primary Examiner—Charles E. Atkinson
Attorney, Agent, or Firm—Christensen, O'Connor, Garrison & Havelka

[57] ABSTRACT

A wide range current flow fault detector comprising a current sensor and a selective interrogator are disclosed. Current flow, or the lack thereof, between a power supply (e.g., capacitor bank) and a load (e.g, the hammer coils of a line printer) is sensed by a current sensor connected to detect the voltages at spaced points along a selected length of the supply conductor connecting the power supply to the load. A differential amplifier forming a part of the current sensor produces an output voltage related to the voltage difference between the selected points. The output voltage of the differential amplifier is compared, in a comparator, with a preset voltage. Any time the output voltage of the differential amplifier is above the preset voltage, the output of the comparator changes from a first state (e.g., low) to a second state (e.g., high). At all other times, the output of the comparator remains in the first state. Thus, the output state of the comparator denotes the presence or absence of current flow through the supply conductor adequate to cause the output of the differential amplifier to rise above the preset level. The interrogator selectively interrogates the output of the comparator to determine if: (1) a current adequate to raise the differential amplifier output above the preset level exists when such a current should be flowing through the supply conductor; and (2) zero current or a current inadequate to raise the differential amplifier output above the preset level exists when zero or very little current should be flowing through the supply conductor.

16 Claims, 4 Drawing Figures

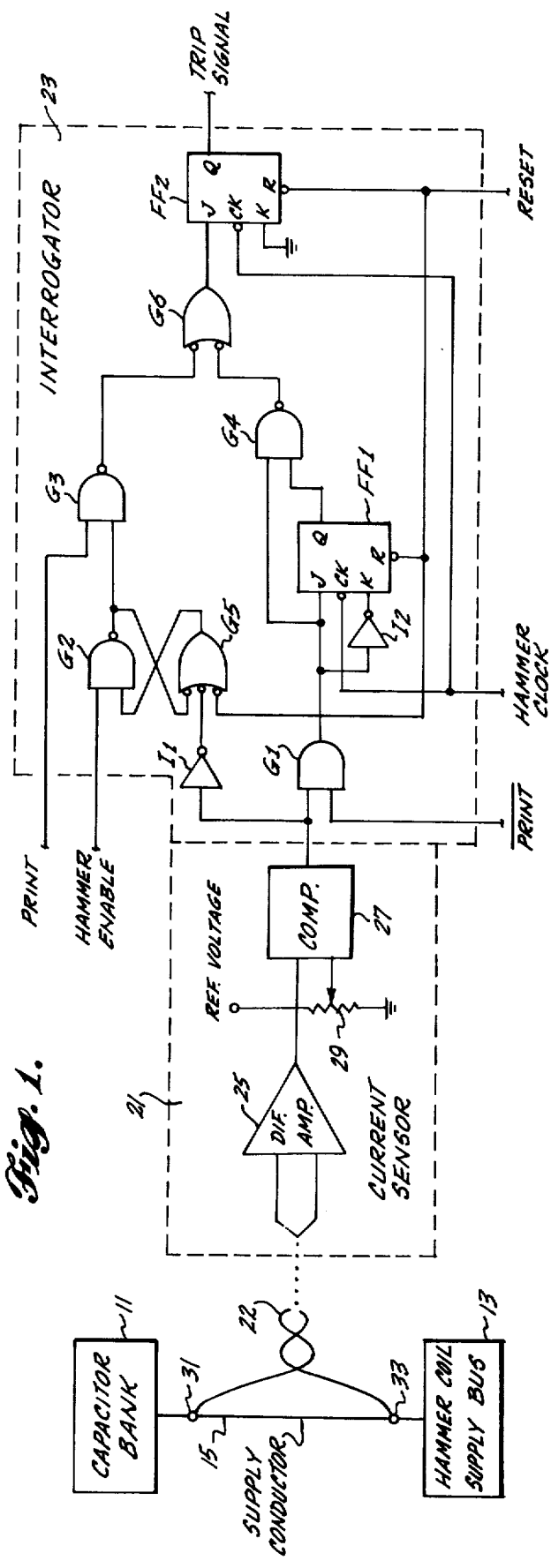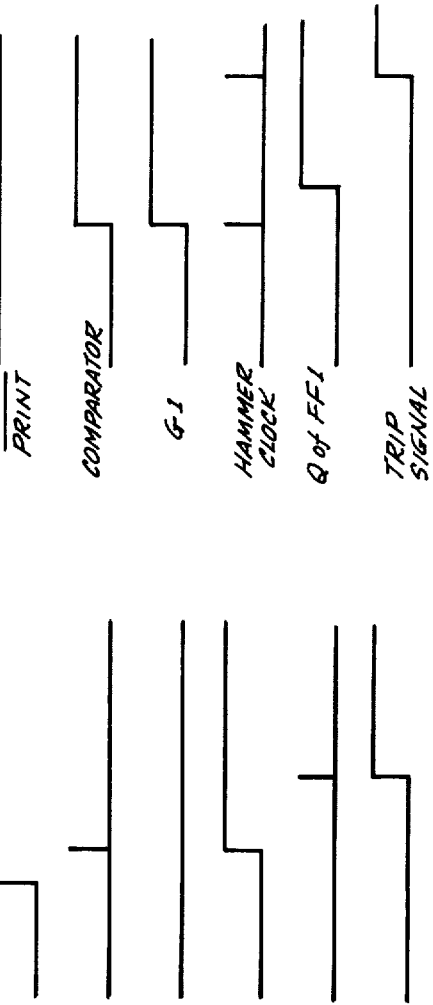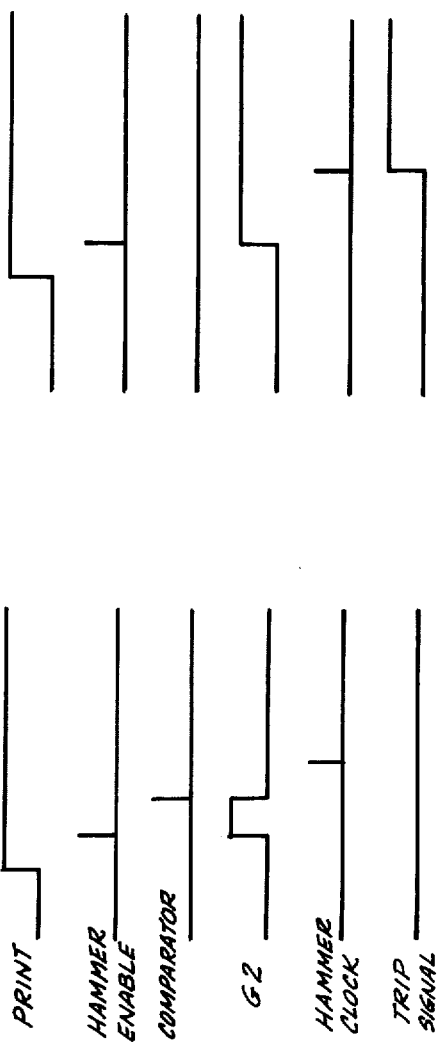

WIDE RANGE CURRENT FLOW FAULT DETECTOR

BACKGROUND OF THE INVENTION

This invention is directed to fault detectors and, more particularly, to current flow fault detectors for detecting the presence or absence of current flow from a power supply to a load.

In various environments, it is desirable, and in fact often necessary, to selectively sense whether or not current is flowing from a power supply to a load in order to prevent damage to electronic equipment and/or the surrounding community. In some such environments, the current flow may vary over a relatively wide range depending upon the number of devices to be activated, making the use of conventional current sensors impracticable or impossible. For example, in a line printer, current is supplied to a plurality of print hammers that are selectively enabled, depending upon the number of characters to be printed in a particular print line. Since each hammer control coil has an individual current draw, and since the coils are simultaneously energized, the total current draw can vary over a wide range. If each coil, for example, draws approximately 3 amps and if a maximum of 66 coils can be simultaneously energized, total current draw can vary from approximately 3 amps to approximately 200 amps. Obviously, a fault exists in such a hammer energization system if current flows to the coils when it should not flow or if zero current (or a minimal current) flows when a current above the level adequate to operate a single hammer should flow.

While relatively sophisticated current sensing devices will operate over wide current ranges of the type discussed above, in general, they are more expensive than desirable. In addition, some such devices unduly load the overall system and, thus, introduce unacceptable voltage losses. For example, systems using Hall effect sensors (which require the production of a magnetic field created by a coil, with core, carrying all of the supply current) are unsatisfactory. Not only are such sensors subject to rapid breakdown in the upper current ranges noted above, but systems using such sensors insufficiently differentiate between high and low currents and introduce unacceptable voltage losses, both resistive and inductive [i.e., $e = L(di/dt)$].

While the present invention was developed for use in combination with printers, particularly line printers, and is described in a line printer environment, as will be understood by those skilled in the art and others, the invention is also suitable for use in other environments.

It is an object of this invention to provide a new and improved current flow fault detector.

It is a further object of this invention to provide a wide range current flow fault detector that is inexpensive and reliable.

It is a still further object of this invention to provide a new and improved wide range current flow fault detector suitable for use in detecting the presence and/or absence of current flow over a wide amperage range, such as a range extending between units of amperes and hundreds of amperes.

It is a still further object of this invention to provide a wide range current flow fault detector suitable for use in a line printer.

SUMMARY OF THE INVENTION

In accordance with principles of this invention, a wide range current flow fault detector is provided. The wide range current flow fault detector of the invention comprises a current sensor and interrogator. Current flow between a power supply and a load is sensed by a current sensor connected to detect the voltages present at two spaced points located along the supply conductor connecting the power supply to the load. The output state of the current sensor is related to the difference between these two voltages. The interrogator selectively interrogates the output of the current sensor to determine if: (1) it achieves the appropriate state when current above a minimal level should flow through the supply conductor; and, (2) if it remains in the appropriate state when zero or current below the minimal level should flow through the supply conductor.

In the preferred form of the invention, the sensor includes a differential amplifier connected to detect the voltages at the spaced points located along the supply conductor and to produce an output voltage related to the difference therebetween. The output of the differential amplifier is compared, in a comparator, with a preset voltage. Any time the output voltage of the differential amplifier rises above the preset voltage, the comparator output changes from a first state to a second state.

Also in the preferred form of the invention, the interrogator is formed of a plurality of digital logic elements and includes two complementary channels that are enabled by the system controlling the flow of current between the power supply and the load. The channels are complementary because when one channel is enabled the other is disabled, and vice versa. When power supply/load current is to flow, one channel is enabled to determine whether or not the current sensor output changes from the first state to the second. At all other times, the other channel is enabled to determine if the sensor output remains in the first state. A combining circuit combines the outputs of the two channels and produces an output control signal indicative of whether or not either channel detects a fault. A fault occurs if either channel fails to sense the appropriate state output of the current sensor that it should sense.

It will be appreciated from the foregoing description that the invention provides a current flow fault detector that is useful for detecting the absence of current when it should exist and the presence of current when it should not exist. The invention is useful over a wide range of currents. Yet, the invention is inexpensive and reliable.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein:

FIG. 1 is a partially block and partially schematic diagram illustrating a preferred embodiment of the invention; and FIGS. 2A–C are timing diagrams utilized to assist in describing the operation of the interrogator portion of the preferred embodiment of the invention illustrated in FIG. 1.

DESCRIPTION OF THE PREFERRED EMBODIMENT

FIG. 1 is a partially schematic and partially block diagram illustrating a preferred embodiment of a wide range current flow fault detector formed in accordance with the invention connected to a sense current flow from a power supply to a load. The particular current supply illustrated is a capacitor bank 11 and the particular load illustrated is a hammer coil supply bus 13, both forming part of a line printer. In such a printer, the hammer coil supply bus 13 is connected to coils adapted to move the hammers of the printer during a print cycle. More specifically, the supply bus is connected to all of the hammer coils. During printing, selected hammer coils are enabled by a control system such that images are formed at selected points in a print line. The images may be entire characters or, as in the Series 4000 line printer produced by the Tally Corporation of Kent, Washington, the images may be dots, with a plurality of dots creating each character image. In either case, the number of hammer coils energized is related to the number of images to be simultaneously formed and varies over a wide range. In the Series 4000 line printer, the range varies from one dot to 66 dots during each dot printing sequence. The current flow for this dot range extends from approximately 3 amps to approximately 200 amps. The invention is suitable for operation over this relatively wide current range.

The wide range current flow fault detector illustrated in FIG. 1 comprises a current sensor 21, a connecting cable 22 and an interrogator 23. The current sensor 21 includes a differential amplifier 25, a comparator 27 and a potentiometer 29. The differential amplifier 25 is connected via the connecting cable 22, illustrated as a twisted wire pair, to a pair of spaced points 31 and 33 located along the supply conductor 15 connecting the capacitor bank 11 to the hammer coil supply bus 13. One of the points 31 is illustrated as being located near the capacitor bank and the other point 33 is illustrated as being located near the hammer coil supply bus 13. It is to be understood that these points are merely illustrative and that the significant item to be understood is that the ends of the two wires forming the conductor 22 are connected to two spaced points located along the length of the supply conductor.

The other ends of the two wires forming the conductor 22 are connected each to one input of the differential amplifier 25. The output of the differential amplifier 25 is connected to one input of the comparator 27. The potentiometer 29 is connected between a reference voltage source and ground. The slide contact of the potentiometer 29 is connected to the second input of the comparator 27.

While various types of differential amplifiers can be utilized by the invention, a suitable differential amplifier arrangement is created by combining an LM321 preamplifier (PRE-AMP), produced by the Signetics Corporation, Sunnyvale, California, with a 558 operational amplifier (OP-AMP) also produced by Signetics Corporation. (The 558 operational amplifier module actually includes two discrete OP-AMPS.) The conductor wires are connected to the two inputs of the PRE-AMP, which is AC balanced with full DC offset to obtain full retention of the common mode rejection ratio formed across the twisted wire pair forming the conductor. The output of the PRE-AMP is connected to one input of one of the 558 OP-AMPS. The other input is grounded. The output of the 558 OP-AMP is, thus, a differential voltage. The level of the differential voltage is related to the difference between the voltages existing at the two spaced points 31 and 33. The second of the two 558 OP-AMPS may be used to form the comparator 27, i.e., in this specific structure the output of the first OP-AMP of the 558 is connected to one input of the second OP-AMP. The second input of the second OP-AMP is connected to the slide contact of the potentiometer 29.

The comparator 27 is a variable threshhold comparator whose output shifts from a first state to a second state when its threshhold level is surpassed. The variable threshhold level controlled by controlling the position of the potentiometer slider. The variable threshhold allows the inventive system to be adjusted to compensate for large variations in the length of the supply conductor lying between the spaced points 31 and 33, in order to set a predetermined minimal current level below which current flow is considered to be zero. If, for example, current flow below 2 amps is to be considered as zero and not cause the comparator to shift states, the potentiometer is adjusted to set a threshhold level such that a current flow of 2 amps or less will create a differential amplifier output lying below the threshhold level.

It will be appreciated from the foregoing discussion that the current sensor 21 generally comprises a device for sensing current flow in a conductor by detecting the voltage difference between spaced points along the conductor. If this voltage difference is above a predetermined level, a differential voltage greater than the threshhold level of a comparator is produced. Preferably, normally, the output of the comparator is at a low state. When a current flow through the supply conductor creates a differential voltage above the threshhold voltage of the comparator, the output of the comparator shifts from its normal low state to a high state. The output of the comparator remains in the high state as long as the current flow through the supply conductor is adequate to create a differential amplifier output voltage above the threshhold level of the comparator.

The interrogator 23 illustrated in FIG. 1 comprises: a two-input positive AND gate designated G1; three two-input positive NAND gates designated G2, G3 and G4; a three-input negative NOR gate designated G5; a two-input negative NOR gate designated G6; two inverters designated I1 and I2; and, two JK flip-flops designated FF1 and FF2. As will be readily understood by those skilled in the art, a positive AND gate only produces a high output when all of its inputs are high; a positive NAND gate only produces a low output when all of its inputs are high; and a negative NOR gate will produce a high output when any one (or more) of its inputs are low.

As noted above, the invention is being described in a line printer environment. In such a printer, when printing is to occur a print enable signal, which may be designated PRINT, shifts from a first state (e.g., low) to a second state (e.g., high). At the same time $\overline{\text{PRINT}}$, which is the complement of PRINT, shifts from the second state to the first state. Subsequent to these print enable signal state changes, one or more hammers are enabled by a signal that they may be designated HAMMER ENABLE, and current flows from the power supply (capacitor bank) to the enabled hammer coils (via the supply conductor and the hammer coil supply bus). After printing, a HAMMER CLOCK signal causes shifting of the HAMMER ENABLE data, and the sequence is repeated. This information should be kept in mind as the nature and operation of the interrogator circuit is described.

The output of the comparator 27 is connected to one input of G1 and through I1 to one input of G5. HAMMER ENABLE is applied to one input of G2. The output of G2 is connected to a second input of G5 and the output of G5 is connected to the second input of G2. Thus, G2 and G5 form an RS latch. The output of G2 is also connected to one input of G3. PRINT is applied to the second input of G3. The output of G3 is connected to one input of G6.

PRINT is applied to the second input of G1. The output of G1 is connected to the J input of FF1 and through I2 to the K input of FF1. The output of G1 is also connected to one input of G4. The Q output of FF1 is connected to the second input of G4. The output of G4 is connected to the second input of G6. The output of G6 is connected to the J input of FF2. The K input of FF2 is connected to ground. The Q output of FF2 forms a fault detection indication or control signal designated "TRIP SIGNAL". HAMMER CLOCK is applied to the clock inputs of FF1 and FF2. In addition, a power-on reset signal, designated RESET, is applied to the reset inputs of FF1 and FF2, and to the third input of G5.

In general, the upper left-hand portion of the interrogator illustrated in FIG. 1 (comprising I1, the G2/G5 RS latch, and G3) form a first interrogator channel that is adapted to selectively interrogate the current sensor to determine if current is flowing from the capacitor bank to the hammer coil supply bus when it should be flowing. The lower left-hand portion (comprising G1, I2, FF1 and G4) forms a second interrogate channel that is adapted to interrogate the output of the supply sensor at all other times the printer is energized to determine if current is flowing through the supply conductor when it should not be flowing. The remaining or right-hand portion of the interrogator (comprising G6 and FF2) forms a timed combining circuit adapted to cause the TRIP SIGNAL to shift from a normal low state to a high state when a fault condition is sensed. The sensed fault conditions are the presence of current above the minimum level when zero or current below the minimal level should be flowing and the absence of current above the minimal level when such current should be flowing.

Turning now to a description of the operation of the interrogator 23, attention is directed to the timing diagrams illustrated in FIGS. 2A–C. FIGS. 2A and 2B are simplified timing diagrams illustrating the operation of the interrogator when the first, or current flow presence sensing, channel is enabled. FIG. 2A illustrates the significant actions that occur when current flow is sensed and FIG. 2B illustrates the significant actions that occur when current is not sensed. FIG. 2C is a simplified timing diagram illustrating the operation of the interrogator when the second, or current flow absence sensing, channel is enabled. Specifically, the FIG. 2C timing diagram illustrates the significant actions that occur if current flow occurs when it should be absent.

Turning first to the situation where current flows through the supply conductor as desired. When PRINT shifts from its low state to its high state, G3 is enabled and G1 is disabled whereby the first channel is enabled and the second channel is disabled. Thereafter, the enabling of one or more of the hammer coils creates a HAMMER ENABLE pulse. The HAMMER ENABLE pulse sets the G2/G5 RS latch, causing the output of G2 to shift from a low state to a high state. The two high inputs to G3 cause its output to shift to a low state and the output of G6 to shift to a high state. At this point, since no HAMMER CLOCK pulse has occurred, the high state output of G6 is not clocked into FF2 and, thus, TRIP SIGNAL remains in a low state. When the current sensor senses a current flow above the minimum level through the supply conductor, the output of the comparator 27, as discussed above, shifts from a low state to a high state and, thus, produces a pulse equal in length to the length of time such a current flow exists. This pulse, illustrated on the third line of FIG. 2A, resets the G2/G5 RS latch whereby the output of G2 returns to a low level, the output of G3 returns to a high level, and the output of G6 returns to a low level. As long as this action occurs prior to the production of a HAMMER CLOCK pulse, the Q output of FF2 remains in a low state.

Turning now to the situation (FIG. 2B) where a zero current flow or a current flow below the minimum level passes through the supply conductor after the G2/G5 RS latch is set. Obviously, this is a fault situation that occurs when printing action has been instructed by the printer but, for some reason or another (e.g., an open hammer coil or coils of the related print hammer or hammers, or failure of the current sensor), current flow from the capacitor bank to the hammer coil supply bus is not sensed.

When PRINT shifts from a low state to a high state, the first channel is enabled as discussed above. Thereafter, the HAMMER ENABLE shift sets the G2/G5 RS latch, also as noted above, and the output of G2 shifts to a high state, whereby the output of G3 shifts to a low state and the output of G6 shifts to a high state. Since in this situation no current flow, above the minimal level, flows in the supply conductor 15, the output of the comparator 27 never shifts from its normal low state to a high state, whereby the G2/G5 RS latch remains set. Since the G2/G5 RS latch remains set, the output of G6 is in a high state when the next HAMMER CLOCK pulse occurs. That clock pulse clocks the high output of G6 into FF2 whereby the Q output of FF2 (i.e., TRIP SIGNAL) shifts from a low state to a high state to denote the existance of a fault. This TRIP SIGNAL shift is utilized to directly or indirectly control some form of overall system disabling element, such as a circuit breaker, and/or a fault indicator.

As noted above, FIG. 2C illustrates the actions that occur when the second channel of the interrogator 23 is enabled and the comparator output shifts from a low state to a high state, denoting the presence of current above the minimum level when such a current should not be present. This channel provides continuous interrogation. That is, as long as $\overline{\text{PRINT}}$ remains in a high state, this channel of the interrogator is enabled.

As will be understood from the previous description, any current in the supply conductor must remain below the minimum level during all non-printing periods of time. A fault occurs if the supply conductor current rises above the minimum level during such periods. When such a current is sensed during non-printing periods (i.e., when $\overline{\text{PRINT}}$ is high), the output of G1 shifts from a low state to a high state. The high output of G1 is clocked into FF1 upon the occurrence of the next HAMMER CLOCK pulse. (The HAMMER CLOCK pulses continuously occur regardless of whether or not printing is to occur). When the high output of G1 is clocked into FF1, the Q output of FF1 shifts to a high state, whereby both inputs of G4 are in high states, causing the output of G4 to shift to a low state. The low state output of G4 causes the output of G6 to achieve a high state. The next occurring HAMMER CLOCK pulse shifts the high state output of G6 into FF2 whereby the Q output and TRIP SIGNAL shift from a low state to a high state to denote a fault, which creates circuit breaker action and/or a fault indication as noted above.

In summary, the interrogator continuously interrogates the output of the current sensor and, thus, the flow of current through the supply conductor. The interrogator determines not only whether or not a current flow occurs when a current flow is expected to occur, it also determines whether or not a current flow occurs when no current flow is expected to occur. In the event that either of these fault conditions happen, the output of the interrogator shifts states to denote the happening of the fault.

As discussed above, the present invention was developed for use in combination with a line printer and has been described in that environment. However, it will be appreciated by those skilled in the arts to which this invention relates that the invention can be utilized in other environments. For example, the invention can be utilized in combination with a stepping motor wherein step control pulses perform the G2/G5 RS latch setting function of HAMMER ENABLE and overall enable control signals perform PRINT and PRINT channel enabling functions. Similarly, the invention can be utilized in other environments.

While a preferred embodiment of the invention has been illustrated and described, it will be appreciated by those skilled in the art and others that various changes can be made therein without departing from the spirit and scope of the invention. For example, different types of logic circuits other than the one specifically illustrated in FIG. 1 can be used to form the interrogator. Further, different types of differential amplifier arrangements and comparators, other than the one specifically described above can be utilized. Hence, the invention can be practiced otherwise than as specifically described herein.

The embodiments of the invention for which an exclusive property or privilege is claimed are defined as follows:

1. A wide range current flow fault detector for detecting the presence of current flow through an electrical conductor at selected intervals and the absence of current flow during other intervals, said wide range current flow fault detector comprising:

A. a current sensor for receiving a current related voltage input and providing an output indicative of whether said current related voltage denotes a current above or below a predetermined minimum level, said current sensor including a two state output circuit having a pair of input terminals for receiving a voltage related to the magnitude of current flow through an electrical conductor, one of said states occurring when the voltage received by said pair of input terminals indicates that the magnitude of the current flow through said electrical conductor is above said predetermined minimum level and the other state occurring when the voltage received by said pair of input terminals indicates that the magnitude of the current flow through said electrical conductor is below said predetermined minimum level;

B. electrical connection means for connecting said pair of input terminals of said two state output circuit to spaced points lying along said electrical conductor; and, C. an interrogator connected to the output of said current sensor for selectively interrogating the output of said current sensor, said interrogator producing a two state fault indicating output, one of said states being a no fault state denoting the presence of current flow through said electrical conductor above said predetermined minimum level during selected intervals or the absence of current flow above said predetermined minimum level during other intervals, and the other of said states being a fault state indicating the absence of current flow through said electrical conductor above said predetermined minimum level during said selected intervals or the presence of current flow through said electrical conductor above said predetermined minimum level during said other intervals.

2. A wide range current flow fault detector as claimed in claim 1 wherein said interrogator includes first and second channels that are alternately enabled, one of said channels connected to said current sensor to sense, when enabled, the shifting of the output of said current sensor to the state indicating the presence of current flow through said electrical conductor above said predetermined minimum level and produce an output related thereto and the other of said channels connected to said current sensor to sense, when enabled, the absence of current flow through said electrical conductor above said predetermined minimum level and produce an output related thereto.

3. A wide range current flow fault detector as claimed in claim 2 wherein said interrogator also includes a combining circuit connected to receive the outputs of said first and second channels and create said fault/no fault state indications in accordance with the outputs of said first and second channels.

4. A wide range current flow fault detector as claimed in claim 3 wherein said two state circuit of said current sensor includes:

a differential amplifier including said pair of input terminals and connected to said electrical connection means for producing an output related to the voltage difference across said spaced points lying along said electrical conductor, a reference voltage source for producing a reference voltage; and, a comparator having one input connected to the output of said differential amplifier and a second input connected to said reference voltage source for producing said two state output of said current sensor, one of said states occurring when the voltage output of the differential amplifier lies below the level of said reference voltage and the other of said states occurring when the voltage output of the differential amplifier lies above the level of said reference voltage.

5. A wide range current flow fault detector as claimed in claim 4 wherein said current sensor also includes an adjustable potentiometer for connecting said reference voltage source to said second input of said comparator whereby the level of the reference voltage applied to said second input of said comparator is adjustable.

6. A wide range current flow fault detector as claimed in claim 5 wherein one of the state outputs of said current sensor is a low state and the other is a high state, said low state indicating that current flow through said electrical conductor is below said minimum level and said high state indicating that current flow through said electrical conductor is above said minimum level.

7. A wide range current flow fault detector as claimed in claim 6 wherein:
said first channel of said interrogator includes an RS latch, the set input of said RS latch adapted to receive a set signal produced immediately preceeding a flow of current through said electrical conductor, the reset input of said RS latch connected to the output of said comparator, said RS latch being formed such that it is reset when the output of said current sensor shifts from a low state to a high state; and
said second channel of said interrogator includes a clockable flip-flop having its input connected to receive the output of said current sensor such that the output of said current sensor is clocked into said clockable flip-flop when said second channel is enabled and a clock signal is applied to said clockable flip-flop.

8. A wide range current flow fault detector as claimed in claim 7 wherein said combining circuit of said interrogator includes an OR function gate having one input connected to receive the output of said RS latch when said first channel is enabled and a second input connected to receive the output of said clockable flip-flop of said second channel, said combining circuit further including a second clockable flip-flop having its input connected to the output of said OR function gate whereby when said second clockable flip-flop is clocked, the output of said OR function gate is clocked into said second clockable flip-flop and controls the output thereof, said output forming said fault/no fault state output of said interrogator.

9. In a line printer wherein: (1) power suitable for energizing one or more selectively enableable hammer coils simultaneously flows from a power supply to all hammer coils selectively enableable via an electrical conductor; (2) a print enable signal and its complement switch from non printing to printing states just prior to the selective enablement of said hammer coils; and, (3) a hammer clock pulse occurs subsequent to the selective enablement of said hammer coils, the improvement comprising a wide range current flow fault detector for detecting the occurrence of current flow through said electrical conductor when said print enable signal and its complement are in printing states and the absence of current flow during other intervals when said print enable signal and its complement are in non printing states, said wide range current flow fault detector comprising:
A. a current sensor for receiving a current related voltage input and providing an output indicative of whether said current related voltage denotes a current above or below a predetermined minimum level, said current sensor including a two state output circuit having a pair of input terminals for receiving a voltage related to the magnitude of current flow through an electrical conductor, one of said states occurring when the voltage received by said pair of input terminals indicates that the magnitude of the current flow through said electrical conductor is above said predetermined minimum level and the other state occurring when the voltage received by said pair of input terminals indicates that the magnitude of the current flow through said electrical conductor is below said predetermined minimum level;
B. electrical connection means for connecting said pair of input terminals of said two state output circuit to spaced points lying along said electrical conductor; and,
C. an interrogator connected to the output of said current sensor for selectively interrogating the output of said current sensor, said interrogator producing a two state fault indicating output, one of said states being a no fault state denoting the presence of current flow through said electrical conductor above said predetermined minimum level when said point enable signal and its complement are in printing states or the absence of current flow above said predetermined minimum level and the other of said states being a fault state indicating the absence of current flow through said electrical conductor above said predetermined minimum level or the presence of current flow through said electrical conductor above said predetermined minimum level when said print enable signal and its complement are in non printing states.

10. The improvement claimed in claim 9 wherein said interrogator includes first and second channels, one of said channels being enabled when said print enable signal and its complement are in printing states and connected to said current sensor to sense, when enabled, the shifting of the output of said current sensor to the state indicating the presence of current flow through said electrical conductor above said predetermined minimum and produce an output related thereto, the other of said channels being enabled when said print enable signal and its complement are in non-printing states and connected to said current sensor to sense, when enabled, the absence of current flow through said electrical conductor above said predetermined minimum level and produce an output related thereto.

11. The improvement claimed in claim 10 wherein said interrogator also includes a combining circuit connected to receive the output of said first and second channels and create said fault/no fault state indications in accordance with the outputs of said first and second channels.

12. The improvement claimed in claim 11 wherein said two state circuit of said current sensor includes:
a differential amplifier including said pair of input terminals connected to said electrical connection means for producing an output related to the voltage difference across said spaced points lying along said electrical conductor, a reference voltage source for producing a reference voltage; and,
a comparator having one input connected to the output of said differential amplifier and a second input connected to said reference voltage source for producing said two state output of said current sensor, one of said states occurring when the voltage output of the differential amplifier lies below the level of said reference voltage and the other of said states occurring when the voltage output of the differential amplifier lies above the level of said reference voltage.

13. The improvement claimed in claim 12 wherein said current sensor also includes an adjustable potentiometer for connecting said reference voltage source to said second input of said comparator whereby the level of the reference voltage applied to said second input of said comparator is adjustable.

14. The improvement claimed in claim 13 wherein one of the state outputs of said current sensor is a low state and the other is a high state, said low state indicating that current flow through said electrical conductor is below said minimum level and said high state indicating that current flow through said electrical conductor is above said minimum level.

15. The improvement claimed in claim 14 wherein:
said first channel of said interrogator includes an RS latch, the set input of said RS latch adapted to receive a set signal produced immediately preceeding a flow of current through said electrical conductor, the reset input of said RS latch connected to the output of said comparator, said RS latch being formed such that it is reset when the output of said current sensor shifts from a low state to a high state; and
said second channel of said interrogator includes a clockable flip-flop having its input connected to receive the output of said current sensor such that the output of said current sensor is clocked into said clockable flip-flop when said second channel is enabled and a clock signal is applied to said clockable flip-flop.

16. The improvement claimed in claim 15 wherein said combining circuit of said interrogator includes an OR function gate having one input connected to receive the output of said RS latch when said first channel is enabled and a second input connected to receive the output of said clockable flip-flop of said second channel, said combining circuit further including a second clockable flip-flop having its input connected to the output of said OR function gate whereby when said second clockable flip-flop is clocked, the output of said OR function gate is clocked into said second clockable flip-flop and controls the output thereof, said output forming said fault/no fault state output of said interrogator.

* * * * *